(12) United States Patent
Zhu

(10) Patent No.: US 10,126,578 B2
(45) Date of Patent: Nov. 13, 2018

(54) BONDING APPARATUS AND BONDING METHOD OF FLEXIBLE DISPLAY MODULE

(71) Applicant: SHENZHEN ROYOLE TECHNOLOGIES CO. LTD., Shenzhen, Guangdong (CN)

(72) Inventor: Jianlei Zhu, Guangdong (CN)

(73) Assignee: SHENZHEN ROYOLE TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 15/752,824

(22) PCT Filed: Dec. 23, 2015

(86) PCT No.: PCT/CN2015/098415
§ 371 (c)(1),
(2) Date: Feb. 14, 2018

(87) PCT Pub. No.: WO2017/107094
PCT Pub. Date: Jun. 29, 2017

(65) Prior Publication Data
US 2018/0246364 A1 Aug. 30, 2018

(51) Int. Cl.
*G02F 1/1333* (2006.01)
*H05K 3/32* (2006.01)
(Continued)

(52) U.S. Cl.
CPC ...... *G02F 1/133305* (2013.01); *G02F 1/1333* (2013.01); *G02F 1/133308* (2013.01);
(Continued)

(58) Field of Classification Search
USPC .................................................. 361/749, 748
See application file for complete search history.

(56) References Cited

U.S. PATENT DOCUMENTS

2012/0125536 A1* 5/2012 Morimoto ......... H01L 21/67092
156/297
2015/0255023 A1* 9/2015 Lee ......................... G09G 3/36
345/204

FOREIGN PATENT DOCUMENTS

CN 102227760 A 10/2011
CN 103295937 A 9/2013
(Continued)

OTHER PUBLICATIONS

International search report issued in corresponding international application No. PCT/CN2015/098415 dated Sep. 8, 2016.

*Primary Examiner* — Andargie M Aychillhum
(74) *Attorney, Agent, or Firm* — Hauptman Ham, LLP

(57) ABSTRACT

A bonding apparatus is provided, which includes a base frame and a bonding platform, a tensioning mechanism, and an elevating mechanism which are disposed on the base frame. The tensioning mechanism includes a first tensioning portion and a second tensioning portion disposed on both sides of the bonding platform respectively. The first tensioning portion and the second tensioning portion are respectively connected to both ends of an object and used to tension the object. The bonding platform includes a bonding plane and the bonding plane is used to contact the object. The elevating mechanism is used to drive the bonding plane and/or the tensioning mechanism to generate a relative displacement between the bonding plane and the tensioning mechanism, and make a surface of the object in contact with the bonding plane flat under an action of both of the bonding platform and the tensioning mechanism.

7 Claims, 6 Drawing Sheets

(51) Int. Cl.
    *G09F 9/30* (2006.01)
    *H01L 51/00* (2006.01)
(52) U.S. Cl.
    CPC .......... *G09F 9/301* (2013.01); *H01L 51/0097* (2013.01); *H05K 3/32* (2013.01)

(56) References Cited

FOREIGN PATENT DOCUMENTS

| | | |
|---|---|---|
| JP | S63313128 A | 12/1988 |
| JP | 2009260379 A | 11/2009 |
| JP | 2009295787 A | 12/2009 |

* cited by examiner

BONDING APPARATUS AND BONDING METHOD OF FLEXIBLE DISPLAY MODULE

RELATED APPLICATIONS

The present application is a National Phase of International Application Number PCT/CN2015/098415, filed Dec. 23, 2015.

TECHNICAL FIELD

The present disclosure relates to the field of flexible display module technology, and particularly to a bonding apparatus and a bonding method of a flexible display module adopting the bonding apparatus.

BACKGROUND

As display technologies advance, flexible display modules will be found in more and more applications. The flexible display module mainly includes a flexible display panel and a corresponding driving circuit. After the flexible display is prepared, an external driving chip needs to be connected onto the flexible display panel via a conductive medium. This process is generally known as bonding. In the bonding process, the conductive medium for enabling connection is generally achieved by an anisotropic conductive film (ACF), characterized in that the film only exhibits electronic conductivity in directions subjected to pressure and is non-conductive in other directions without pressure. However, if the bonding is directly performed on the flexible display panel, due to the high temperature and hot pressure environment in the bonding process, the flexible display panel can be easily deformed, resulting in inaccurate alignment during bonding and therefore severely affecting the product quality.

SUMMARY

Embodiments of the present disclosure provide a bonding apparatus with a high yield rate and a bonding method of a flexible display module adopting the bonding apparatus.

To achieve the above purpose, implementations of the present disclosure provide the following technical solutions.

According to one aspect of the present disclosure, there is provided a bonding apparatus. The bonding apparatus includes a base frame and a bonding platform, a tensioning mechanism, and an elevating mechanism which are disposed on the base frame.

The tensioning mechanism includes a first tensioning portion disposed on one side of the bonding platform and a second tensioning portion disposed on the other side of the bonding platform. The first tensioning portion is connected to one end of an object and the second tensioning portion is connected to the other end of the object. The first tensioning portion and the second tensioning portion are used to tension the object.

The bonding platform includes a bonding plane and the bonding plane is used to contact the object.

The elevating mechanism is used to drive at least one of the bonding plane and the tensioning mechanism to generate a relative displacement between the bonding plane and the tensioning mechanism, and make a surface of the object smooth in contact with the bonding plane under an action of both of the bonding platform and the tensioning mechanism.

According to another aspect of the present disclosure, there is provided a bonding method of a flexible display module. The method is used to bond an integrated circuit to a first bonding area of a flexible display panel. The method includes the following operations.

A tensioning mechanism tensions the flexible display panel.

An elevating mechanism drives at least one of a bonding plane of a bonding platform and the tensioning mechanism to move, to make the bonding plane push up the first bonding area.

The integrated circuit is aligned with the first bonding area.

The integrated circuit and the first bonding area are pressed together.

Compared with the related art, the embodiments of the disclosure have the following advantageous effect.

According to the bonding apparatus of the disclosure, the first tensioning portion of the tensioning mechanism is connected to one end of the object and the second tensioning portion of the tensioning mechanism is connected to the other end of the object, so as to tension the object. The bonding plane of the bonding platform is disposed between the first tensioning portion and the second tensioning portion and is used to contact a middle part of the object. When the elevating mechanism drives the bonding plane and/or the tensioning mechanism such that the relative displacement occurs between the bonding plane and the tensioning mechanism, under the action of both of the bonding platform and the tensioning mechanism, the entire object is tensioned and part of the object is pressed tightly on the bonding plane, and thus the surface of the object in contact with the bonding plane is smooth. Furthermore, an area to-be-bonded of the object is in contact with the bonding plane, to ensure an accuracy of bonding alignment in the bonding process. That is, the object can be bonded by one pressing action, and in this way, it is possible to effectively improve the bonding efficiency and the yield rate of the object.

According to the bonding method of the flexible display module of the disclosure, since the flexible display panel maintains flat, that is, the first bonding area has a good flatness, the accuracy of bonding alignment in the bonding process can be ensured. In other words, the flexible display panel and the integrated circuit can be bonded by one pressing action and thereby achieving higher bonding efficiency and higher yield rate.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show some embodiments of the present disclosure. Those of ordinary skill in the art may also obtain other drawings based on these accompanying drawings without creative efforts.

DETAILED DESCRIPTION OF ILLUSTRATED EMBODIMENTS

The technical solutions in the embodiments of the present disclosure will be described clearly and completely hereinafter with reference to the accompanying drawings in the embodiments of the present disclosure. Apparently, the described embodiments are merely some but not all embodiments of the present disclosure. All other embodiments obtained by those of ordinary skill in the art based on the embodiments of the present disclosure without creative efforts shall fall within the protection scope of the present disclosure.

Figure 1:
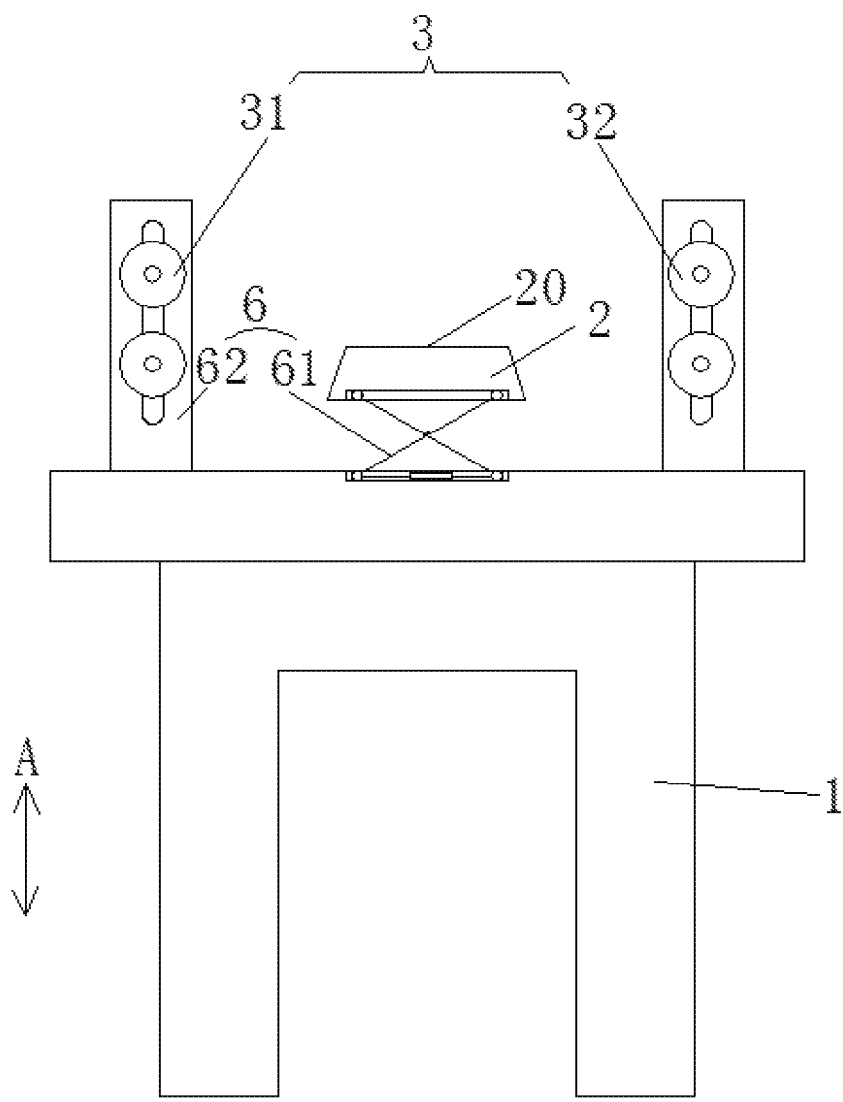
FIG. 1 is a structural schematic diagram illustrating a bonding apparatus according to an embodiment of the present disclosure.

Referring to FIG. 1, according to embodiments of the present disclosure, there is provided a bonding apparatus to bond an object. For example, the apparatus can achieve a bonding process of a flexible display panel and an integrated circuit. The object herein may be a flexible display panel or an integrated circuit. Generally, the object is a flexible display panel. As illustrated in FIG. 1, the bonding apparatus includes a base frame 1 and a bonding platform 2, a tensioning mechanism 3, and an elevating mechanism 6 which are disposed on the base frame. The tensioning mechanism 3 includes a first tensioning portion 31 disposed on one side of the bonding platform 2 and a second tensioning portion 32 disposed on the other side of the bonding platform 2. The first tensioning portion 31 is connected to one of an object and the second tensioning portion 32 is connected to the other end of the object. The first tensioning portion 31 and the second tensioning portion 32 are used to tension the object. The bonding platform 2 includes a bonding plane 20 and the bonding plane 20 is used to contact the object. The elevating mechanism 6 is used to drive at least one of the bonding plane 20 and the tensioning mechanism 3 to generate a relative displacement between the bonding plane 20 and the tensioning mechanism 3, and snake a surface of the object smooth in contact with the bonding plane 20 under an action of both of the bonding platform 2 and the tensioning mechanism 3.

In the embodiment, the first tensioning portion 31 of tensioning mechanism 3 of the bonding apparatus is connected to one end of the object and the second tensioning portion 32 of tensioning mechanism 3 of the bonding apparatus is connected to the other end of the object. The first tensioning portion 31 and the second tensioning portion 32 are used to tension the object. The bonding plane 20 of the bonding platform 2 is located between the first tensioning portion 31 and the second tensioning portion 32 and used to contact a middle part of the object. When the elevating mechanism 6 drives the bonding plane 20 and/or the tensioning mechanism 3 to cause the relative displacement between the bonding plane 20 and the tensioning mechanism 3, under the action of both of the bonding platform 2 and the tensioning mechanism 3, the entire object is tensioned and part of the object is pressed on the bonding plane 20 tightly, such that the surface of the object in contact with the bonding plane 20 is smooth. Furthermore, an area to-be-bonded of the object is in contact with the bonding plane 20, to ensure an accuracy of bonding alignment in the bonding process. Therefore, a bonding action of the object can be completed by one pressing action and as a result, the bonding efficiency and the yield rate of the object can be effectively improved.

For example, when the bonding apparatus bonds a second bonding area of the integrated circuit to a first bonding area of the flexible display panel, the first bonding area is pressed on the bonding plane 20 tightly to make the first bonding area smooth, and then the bonding alignment and the pressing action of the second bonding area and the first bonding area are performed, thus improving the bonding efficiency and the yield rate of the object effectively.

In the embodiment, the bonding plane 20 should be a smooth plane and have an area larger than or equal to that of the area to-be-bonded of the object, to further ensure that the area to-be-bonded is in a flat status in the bonding process. Furthermore, the area of the bonding plane 20 is only slightly larger than that of the area to-be-bonded of the object to reduce, in the pressing process, an area of base material of the object affected by high temperature, so as to further increase the yield rate of the object. As one implementation, a ratio of the area of the bonding plane 20 to that of the area to-be-bonded of the object is in a range of 1~1.5.

In the embodiment, the first tensioning portion 31 may be used to provide a tension in a first direction and the second tensioning portion 32 may be used to provide a tension in a second direction, where the second direction is opposite to the first direction. It should be noted that, the relation between the first direction and the second direction includes, but is not limited to, the opposite relation, and may also be other relations, as long as both ends of the object can be tensioned.

Figure 2:
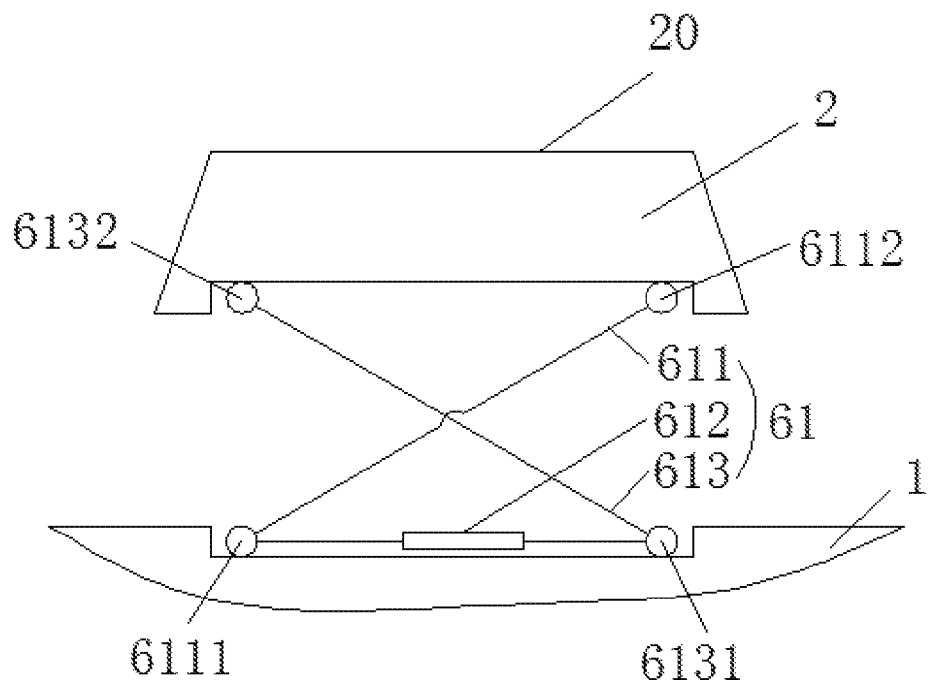
FIG. 2 is a structural schematic diagram illustrating a bonding platform of a bonding apparatus according to an embodiment of the present disclosure.

Furthermore, referring to FIG. 1 and FIG. 2, as one implementation, the elevating mechanism 6 includes a first driving component 61. The first driving component 61 connects the bonding platform 2 and the base frame 1 and is used to drive the bonding platform 2 move towards or away from the base frame 1, to cause the relative displacement between the bonding plane 20 and the tensioning mechanism 3, and therefore the bonding plane 20 can press tightly on, fit with, or move away from the object.

Furthermore, referring to FIG. 1 and FIG. 2, the first driving component 61 includes a pitch adjusting structure 612, a first connecting rod 611, and a second connecting rod 613, where the first connecting rod 611 and the second connecting rod 613 have the same length. A middle part of the first connecting rod 611 is hinged with a middle part of the second connecting rod 613. The pitch adjusting structure 612 is used to adjust a distance between one end of the first connecting rod 611 and one end of the second connecting rod 613. As illustrated in FIG. 2, when the pitch adjusting structure 612 adjusts to reduce the distance between one end 6111 of the first connecting rod 611 and one end 6131 of the second connecting rod 613, a distance between the other end 6112 of the first connecting rod 611 and the other end 6132 of the second connecting rod 613 is also reduced, accordingly, a distance between the one end 6111 of the first connecting rod 611 and the other end 6132 of the second connecting rod 613, as well as a distance between the one end 6131 of the second connecting rod 613 and the other end 6112 of the first connecting rod 611 are increased. That is, the bonding platform 2 moves away from the base frame 1 such that the relative displacement occurs between the bonding plane 20 and the tensioning mechanism 3, and consequently the bonding plane 20 can press the object tightly. Similarly, when the pitch adjusting structure 612 adjusts to increase the distance between one end 6111 of the first connecting rod 611 and one end 6131 of the second connecting rod 613, the distance between the other end 6112 of the first connecting rod 611 and the other end 6132 of the second connecting rod 613 is also increased, accordingly, the distance between the one end 6111 of the first connecting rod 611 and the other end 6132 of the second connecting rod 613, and the distance between the one end 6131 of the second connecting rod 613 and the other end 6112 of the first connecting rod 611 are reduced. That is to say, the bonding platform 2 moves close to the base frame 1 such that the relative displacement occurs between the bonding plane 20 and the tensioning mechanism 3, and as a result the bonding plane 20 can move away from the object.

Figure 3:
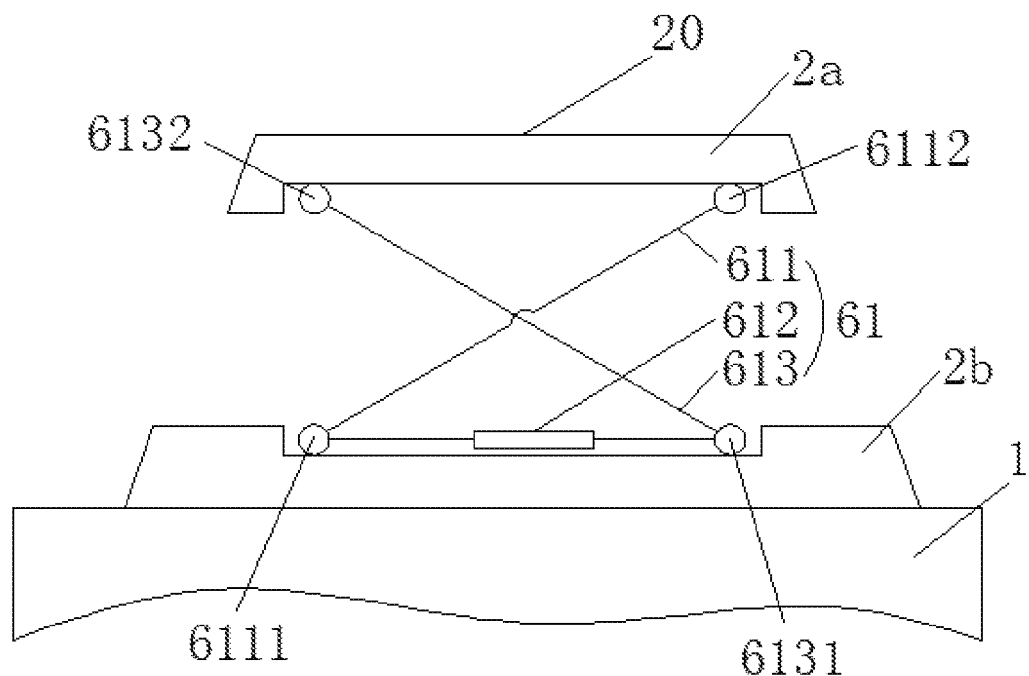
FIG. 3 is another structural schematic diagram illustrating a bonding platform of a bonding apparatus according to an embodiment of the present disclosure.

Furthermore, referring to FIG. 1 and FIG. 3, as another implementation, the elevating mechanism 6 includes a first driving component 61. The bonding platform 2 includes a first portion 2a and a second portion 2b, where an upper surface of the first portion 2a is the bonding plane 20 and the second portion 2b is fixed to the base frame 1. The first driving portion 61 is disposed between the first portion 2a and the second portion 2b and is used to drive the first portion 2a to move close to or away from the second portion 2b, so as to cause the relative displacement between the bonding plane 20 and the tensioning mechanism 3, and thus the bonding plane 20 can press tightly on, fit with, or move away from the object.

Furthermore, referring to FIG. 1 and FIG. 3, the first driving component 61 includes a pitch adjusting structure 612, a first connecting rod 611, and a second connecting rod 613 having a length equal to that of the first connecting rod 611. A middle part of the first connecting rod 611 is hinged with a middle part of the second connecting rod 613. The pitch adjusting structure 612 is used to adjust a distance between one end of the first connecting rod 611 and one end of the second connecting rod 613. As illustrated in FIG. 3, when the pitch adjusting structure 612 adjusts to reduce the distance between one end 6111 of the first connecting rod 611 and one end 6131 of the second connecting rod 613, a distance between the other end 6112 of the first connecting rod 611 and the other end 6132 of the second connecting rod 613 is also reduced, correspondingly, a distance between the one end 6111 of the first connecting rod 611 and the other end 6132 of the second connecting rod 613, and a distance between the one end 6131 of the second connecting rod 613 and the other end 6112 of the first connecting rod 611 are increased. That is, the first portion 2a moves away from the second portion 2b so that the relative displacement is generated between the bonding plane 20 and the tensioning mechanism 3, and consequently the bonding plane 20 can impact the object. Likewise, when the pitch adjusting structure 612 adjusts to increase the distance between one end 6111 of the first connecting rod 611 and one end 6131 of the second connecting rod 613, the distance between the other end 6112 of the first connecting rod 611 and the other end 6132 of the second connecting rod 613 is also increased, accordingly, the distance between the one end 6111 of the first connecting rod 611 and the other end 6132 of the second connecting rod 613, and the distance between the one end 6131 of the second connecting rod 613 and the other end 6112 of the first connecting rod 611 are reduced. That is to say, the first portion 2a moves near the second portion 2b so that the relative displacement is generated between the bonding plane 20 and the tensioning mechanism 3, and as a result the bonding plane 20 can move away from the object.

It should be understood that, the bonding platform 2 of the embodiment may include even more portions, for example, three portions, and adjacent portions can be connected via structures similar to the first driving component 61, so as to adjust distances between the adjacent portions. The more constituent portions of the bonding platform 2, the larger an adjusting range of the bonding plane 20, therefore the versatility of the bonding apparatus can be improved.

Furthermore, the pitch adjusting structure 612 of the first driving component 61 may be any structure capable of achieving a pitch adjustment, such as a bolt structure, a screw structure, and the like.

Figure 4:
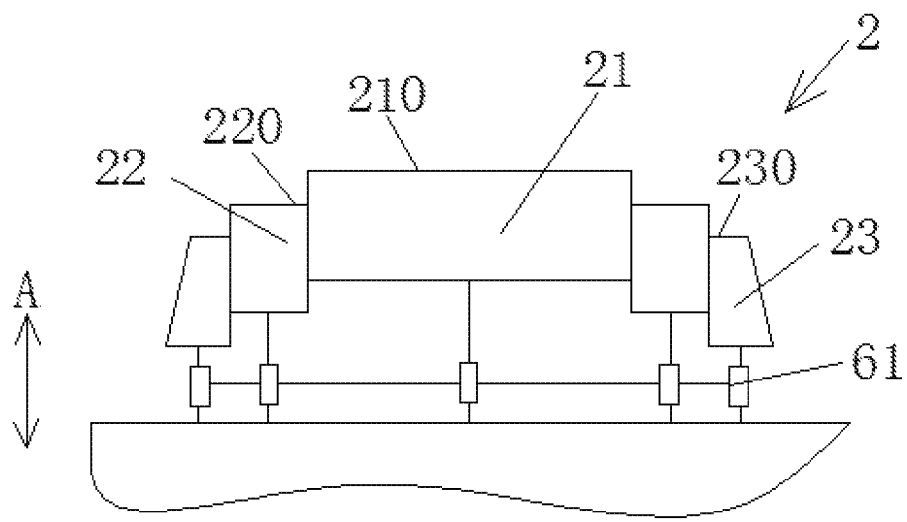
FIG. 4 is still another structural schematic diagram illustrating a bonding platform of a bonding apparatus according to an embodiment of the present disclosure.
Figure 5:
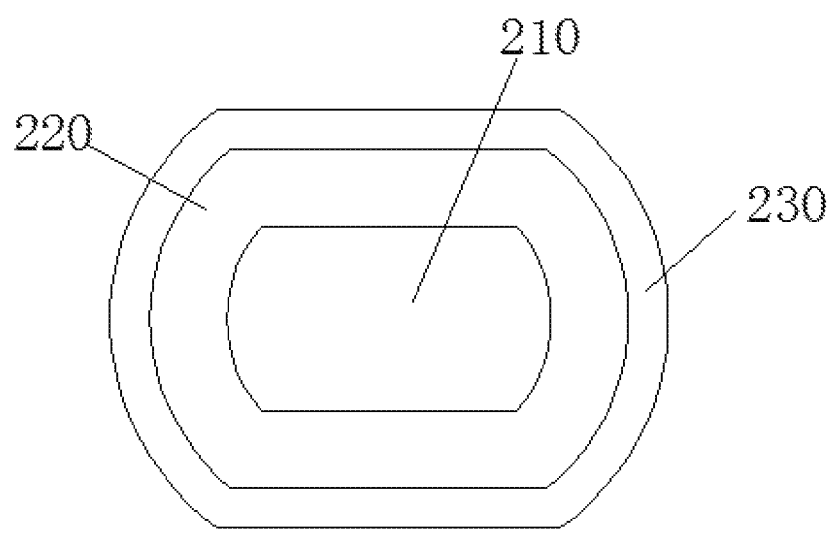
FIG. 5 is a structural schematic top view illustrating the embodiment of FIG. 4.

Furthermore, referring to FIG. 1, FIG. 4, and FIG. 5, as still another implementation, the bonding platform 2 of the bonding apparatus includes a first protrusion 21, a second protrusion 22, and a third protrusion 23. The first driving component 61 is used to drive the first protrusion 21 to rise, such that an upper surface 210 of the first protrusion 21 forms the bonding plane 20. Alternatively, the first driving component 61 is used to drive the first protrusion 21 and the second protrusion 22 to rise, such that the upper surface 210 of the first protrusion 21 and an upper surface 220 of the second protrusion 22 are coplanar to form the bonding plane 20. Alternatively, the first driving component 61 is used to drive the first protrusion 21, the second protrusion 22, and the third protrusion 23 to rise, such that the upper surface 210 of the first protrusion 21, the upper surface 220 of the second protrusion 22, and an upper surface 230 of the third protrusion 23 are coplanar to form the bonding plane 20. That is, the bonding plane may have different bonding areas, so that the bonding apparatus can be applied to multiple components to-be-bonded with different bonding areas, thereby improving the flexibility and scope of application of the bonding apparatus. The first driving component 61 may be disposed with reference to the structure of the first driving component described in the foregoing embodiments and is not described herein again.

Figure 6:
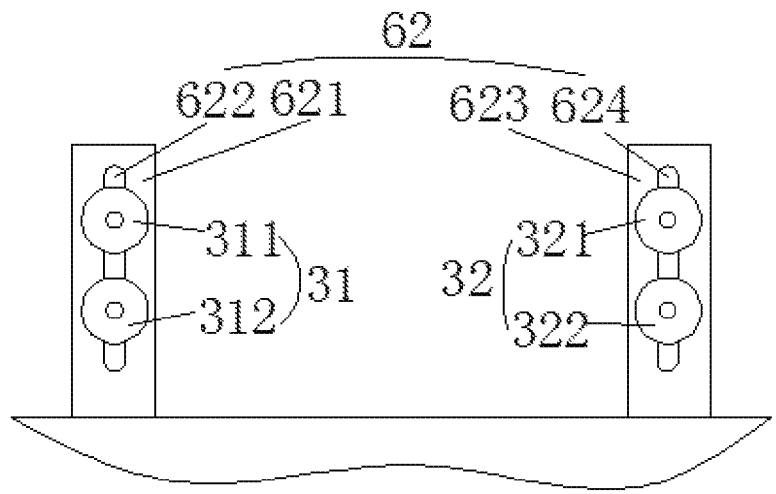
FIG. 6 is a structural schematic diagram illustrating a tensioning mechanism of a bonding apparatus according to an embodiment of the present disclosure.

Furthermore, referring to FIG. 1 and FIG. 6, the elevating mechanism 6 includes a second driving component 62, wherein the second driving component 62 includes a first bracket 621 disposed one side of the bonding platform and a second bracket 623 disposed on the other side of the bonding platform. The first bracket 621 is provided with a first sliding rail 622, the second bracket 623 is provided with a second sliding rail 624, and sliding paths of the first sliding rail 622 and the second sliding rail 624 are both perpendicular to the bonding plane 20. The first tensioning portion 31 is movably connected to the first sliding rail 622 and the second tensioning portion 32 is movably connected to the second sliding rail 624. In the embodiment, the first tensioning portion 31 slides on the first sliding rail 622 and the second tensioning portion 32 slides on the second sliding rail 624, so that a relative displacement between bonding plane 20 and the tensioned object on the tensioning mechanism 3 is generated, and therefore the bonding plane 20 can impact with, fit with, or move away from the object.

Figure 7:
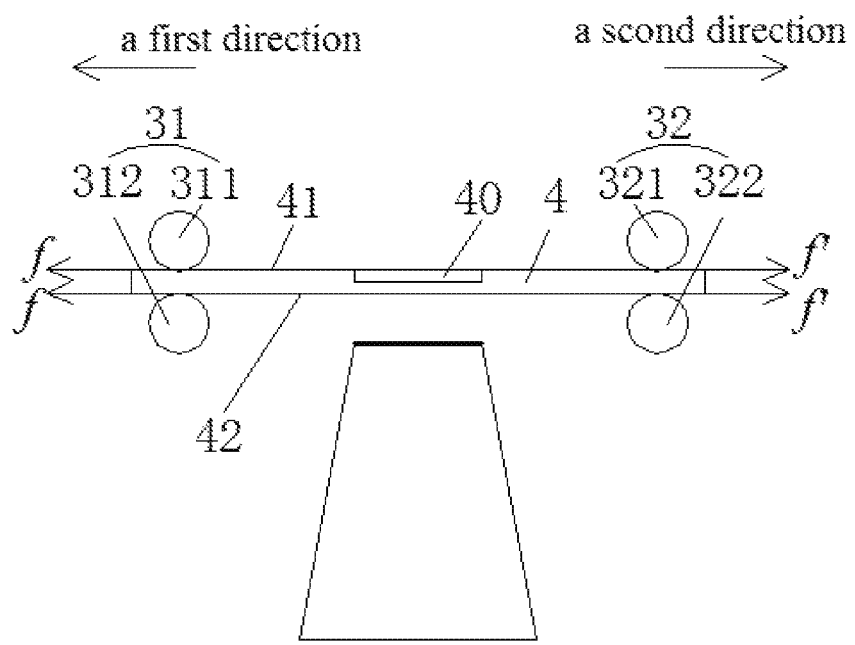
FIG. 7 and FIG. 9 to FIG. 11 are structural schematic diagrams illustrating manufacture processes corresponding to various steps of a bonding method of a flexible display module according to an embodiment of the present disclosure.

Furthermore, referring to FIG. 1, FIG. 6, and FIG. 7, the first tensioning portion 31 of the bonding apparatus includes a pair of first rollers (311, 312) disposed apart from each other. The first rollers (311, 312) are used to clamp one end of the object (for example, a flexible display panel 4 as illustrated in FIG. 7) disposed between the first rollers (311, 312). That is, the first roller 311 clamps a first surface 41 of the flexible display panel 4, and the first roller 312 clamps a second surface 42 of the flexible display panel 4 opposite to the first surface 41. When a first friction f (as illustrated in FIG. 7, the friction f indicating a first direction) between the first rollers (311, 312) and the object (i.e., the flexible display panel 4) is less than or equal to a predetermined value, the first rollers (311, 312) do not roll; when the first friction f is greater than the predetermined value, the first rollers (311, 312) roll. When the first rollers (311, 312) stop rolling, it indicates that the first friction f has reduced to a value less than or equal to the predetermined value. Therefore, the first tensioning portion 31 may apply to the flexible display panel 4 a tension less than or equal to the predetermined value. In the embodiment, to ensure that one end of the flexible display panel 4 is not deformed, the first friction between the first roller 311 and the first surface 41 is equal to the first friction between the first roller 312 and the second surface 42.

In this embodiment, the second tensioning portion 32 includes a pair of second rollers (321, 322) disposed apart from each other. The second rollers (321, 322) are used to clamp the other end of the object (for example, the flexible display panel 4 as illustrated in FIG. 7) disposed between the second rollers (321, 322). That is, the second roller 321 clamps the first surface 41 of the flexible display panel 4, and the second roller 322 clamps the second surface 42 of the flexible display panel 4 opposite to the first surface 41. When a second friction f' (as illustrated in FIG. 7, the friction f' indicating a second direction) between the second rollers (321, 322) and the object (i.e., the flexible display panel 4) is less than or equal to the predetermined value, the second rollers (321, 322) do not roll; when the second friction f' is greater than the predetermined value, the second rollers (321, 322) roll. When the second rollers (321, 322) stop rolling, it means that the second friction f' has reduced to a value less than or equal to the predetermined value. Therefore, the second tensioning portion 32 may apply to the flexible display panel 4 a tension less than or equal to the predetermined value. In the embodiment, to ensure that the other end of the flexible display panel 4 is not deformed, the second friction between the second roller 321 and the first surface 41 is equal to the second friction between the second roller 322 and the second surface 42.

In the embodiment, by setting a rolling threshold (i.e., the predetermined value) to the first rollers (311, 312) and the second rollers (321, 322), the tension provided by the first tensioning portion 31 and the second tensioning portion 32 is less than the predetermined value. In other words, when the bonding apparatus bonds the object (for example, the flexible display panel), the maximum value of the tension applied to the flexible display panel can be controlled by setting the magnitude of the predetermined value, so that the tension can be within a reasonable acceptable range of the flexible display panel. As a result, the tensioning mechanism 3 can stretch the flexible display panel to be flat without harming the flexible display panel, and thus ensuring the accuracy of bonding alignment in the bonding process. In other words, the flexible display panel and the integrated circuit can be bonded by one pressing action and therefore higher bonding efficiency and higher yield rate can be achieved.

In the embodiment, multiple manners can be used to set the predetermined value. For example, the predetermined value can be obtained by testing or calculating material property of the object; the predetermined value can be derived according to empirical data; the experiment of bonding the object can be performed and the predetermined value can also be inversely estimated from the best bonding effect. As long as it is able to draw a reasonable predetermined value to achieve the purpose of the present disclosure, the present disclosure will not be particularly restricted.

Furthermore, outer diameters of the first rollers (311, 312) can be identical to that of the second rollers (321, 322), and outer surfaces of the first rollers (311, 312) can be made of the same material as that of the second rollers (321, 322), to facilitate simultaneously management and adjustment of the magnitude of the friction between the first tensioning portion 31 and the flexible display panel as well as between the second tensioning portion 32 and the flexible display panel.

Furthermore, the magnitude of the outer diameter and the material of the outer surface of the first roller and the second roller, and the distance between the first roller and the second roller can be replaced or modified, to realize a change in the magnitude of the friction between the first tensioning portion and the object as well as the second tensioning portion and the object. Meanwhile, the magnitude of the predetermined value of the tensioning mechanism may also be modified to adapt to more bonding processes with different requirements and improve the universality of the bonding apparatus.

According to embodiments of the disclosure, there is also provided a bonding method of a flexible display panel. Referring to FIG. 1 and FIG. 7 to FIG. 11, the method is used to bond an integrated circuit 5 to a first bonding area 40 of a flexible display panel 4. The method includes the following operations.

Figure 8:
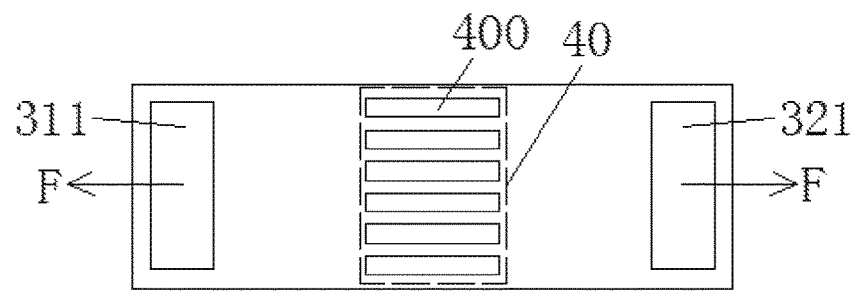
FIG. 8 is a top view illustrating the structure of FIG. 7.

At Step 1, referring to FIG. 1, FIG. 7, and FIG. 8, the flexible display panel 4 is tensioned to keep the flexible display panel 4 in a flat status by the tensioning mechanism 3.

Figure 9:
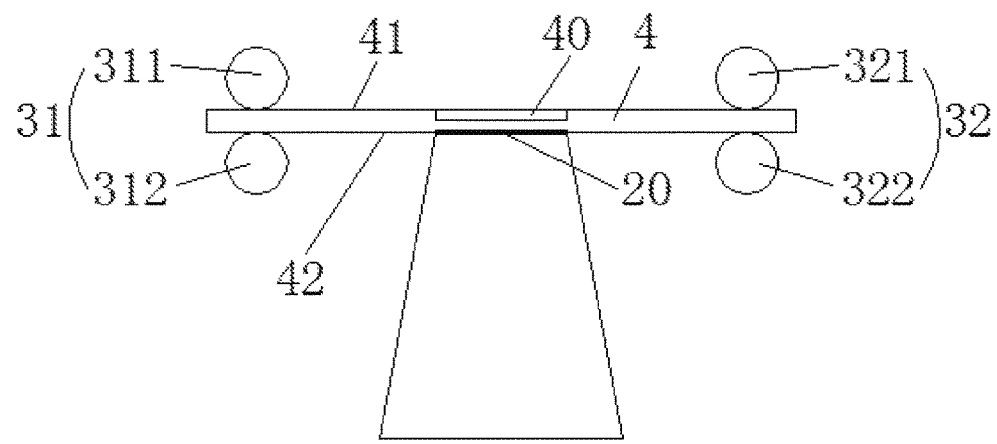
Figure 10:
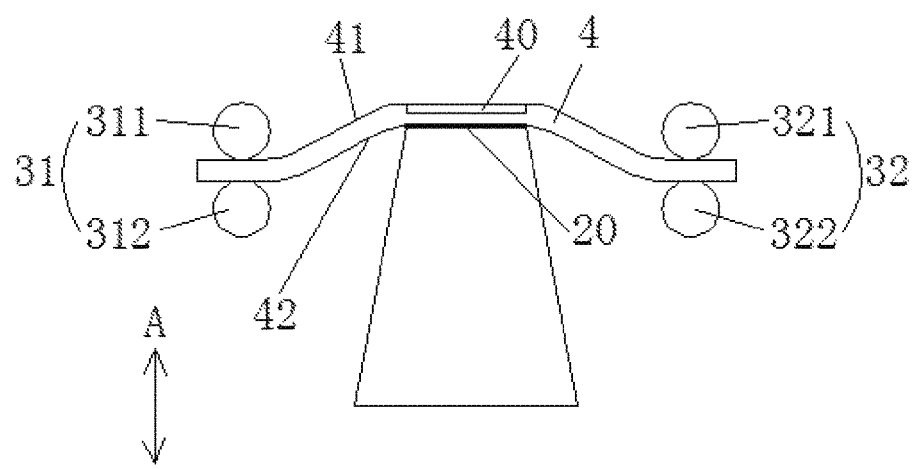

At Step 2, referring to FIG. 1, FIG. 9, and FIG. 10, the bonding plane 20 of the bonding platform 2 and/or the tensioning mechanism 3 is driven to move by the elevating mechanism 6, so that the first bonding area 40 is pushed up by the bonding plane 20. It should be understood that, pushing up means arching from below. When the first bonding area 40 is pushed up, the first bonding area 40 of the flexible display panel 4 relatively protrudes from both sides thereof, as illustrated in FIG. 10. In this situation, the first bonding area 40 is tensioned and pressed on the bonding platform to maintain the flat status.

Figure 11:
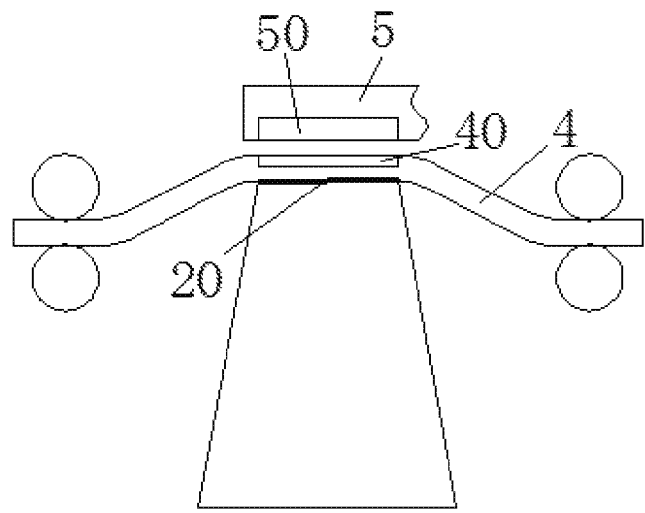

At Step 3, referring to FIG. 11, the integrated circuit 5 is aligned with the first bonding area 40. Furthermore, in this step, a second bonding area 50 of the integrated circuit 5 is aligned with the first bonding area 40.

At Step 4, the integrated circuit 5 and the first bonding area 40 are pressed together to form the flexible display module. Furthermore, in this step, the second bonding area 50 of the integrated circuit 5 and the first bonding area 40 are pressed together.

In the embodiment, the flexible display panel 4 is tensioned in the Step 1, and therefore the first bonding area 40 has a certain flatness preliminary. Thereafter, in the Step 2, the first bonding area 40 is pressed tightly on the bonding plane 20, and at this moment, the first bonding area 40 has a good flatness. As a result, the accuracy of bonding alignment (i.e., Step 3) in the bonding process can be ensured, that is, the flexible display panel and the integrated circuit can be bonded by one pressing action (i.e., Step 4) and therefore the bonding efficiency and yield rate of the object can be improved effectively.

Furthermore, referring to FIG. 1, FIG. 7 and FIG. 8, the first bonding area 40 of the flexible display panel 4 has a plurality of bonding pads 400. When the tensioning mechanism 3 tensions the flexible display panel 4, a direction of tension (F as illustrated in FIG. 8) applied by the tensioning mechanism 3 is consistent with an extending direction of each bonding pad 400. As the bonding pads 400 is tensioned in the length direction thereof, distances between adjacent bonding pads 400 will remain un-changed during the tensioning action, thus facilitating the subsequent alignment process.

Furthermore, in the Step 2, that the bonding plane 20 of the bonding platform 2 and/or the tensioning mechanism 3 is driven to move by the elevating mechanism 6 includes the following.

The bonding plane 20 is driven to rise by the elevating mechanism 6.

Alternatively, the tensioning mechanism 3 is driven to descend by the elevating mechanism 6.

Alternatively, the bonding plane 20 is driven to rise and the tensioning mechanism 3 is driven to descend by the elevating mechanism 6.

It should be noted that, the above steps are performed to generate a relative displacement between the bonding plane 20 and the tensioning mechanism 3, and thus under an action of both of the bonding platform 2 and the tensioning mechanism 3, a surface of the flexible display panel 4 in contact with the bonding plane 20 is smooth.

For example, as one implementation, referring to FIG. 1, FIG. 9, and FIG. 10, in the Step 2, that at least one of the bonding plane 20 of the bonding platform 2 and the tensioning mechanism 3 is driven to move by the elevating mechanism 6 to push up the first bonding area 40 by the bonding plane 20 includes the following.

As illustrated in FIG. 9, the flexible display panel 4 is moved by the tensioning mechanism 3, to align and fit a center of the first bonding area 40 with that of bonding plane 20.

Thereafter, as illustrated in FIG. 10, the tensioning mechanism 3 continues to move the flexible display panel 4 along a direction A perpendicular to the bonding plane, to press the first bonding area 40 against the bonding plane 20. In this situation, the tensioning mechanism 3 actually moves both ends of the flexible display panel 4, and the first bonding area 40 is pressed against the bonding plane 20 under the tension of the both ends of the flexible display panel 4, where the flexible display panel 4 assumes a "convex" shape.

Furthermore, as another implementation, referring to FIG. 1, FIG. 9, and FIG. 10, in the Step 2, that at least one of the bonding plane 20 of the bonding platform 2 and the tensioning mechanism 3 is driven to move by the elevating mechanism 6 to push up the first bonding area 40 by the bonding plane 20 includes the following.

The flexible display panel 4 is moved by the tensioning mechanism 3, to align a center of the first bonding area 40 with that of bonding plane 20.

Thereafter, the bonding plane 20 is moved, so that the first bonding area 40 is pressed tightly on the bonding plane 20. In this situation, the bonding plane 20 presses the first bonding area 40 tightly and the flexible display panel 4 assumes a "convex" shape.

Furthermore, in the bonding method, the tension provided by the tensioning mechanism 3 is less than or equal to a certain predetermined value, so the maximum value of the tension provided by the tensioning mechanism 3 can be controlled by setting the magnitude of the predetermined value. In other words, in the Step 1 and Step 2 of the bonding method, the tension applied by the tensioning mechanism 3 to the flexible display panel 4 is less than the predetermined value, where the magnitude of the predetermined value does not exceed a reasonable acceptable range of the flexible display panel, so as to stretch the flexible display panel to maintain flat without damaging the flexible display panel.

Figure 12:
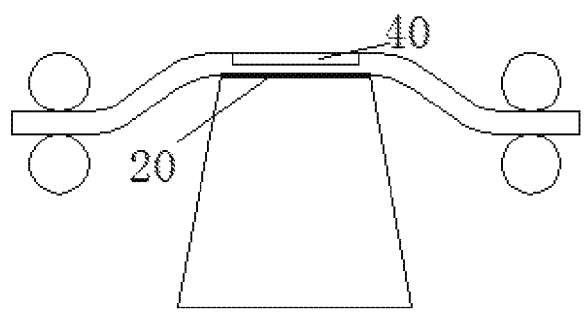
FIG. 12 is a structural schematic diagram in which an object is pressed tightly on a bonding plane in a bonding method of a flexible display module according to an embodiment of the present disclosure.

It should be noted that, in the embodiment, the bonding plane 20 (at the location indicated by the bold line 20 in FIG. 9 and FIG. 10) is a flat plane and has an area larger than or equal to that of the first bonding area 40, so as to further ensure that the first bonding area 40 is in a smooth status during the bonding process. Furthermore, the area of the bonding plane 20 is only slightly larger than that of the first bonding area 40 to reduce, in the pressing process, an area of a flexible substrate of the flexible display panel 4 affected by the high temperature, so that the yield rate of the flexible display module can be further improved. As one implementation, a ratio of the area of the bonding plane 20 to that of the first bonding area 40 is 1.2 to 1. Referring to FIG. 12, the bonding plane 20 has the area slightly larger than that of the first bonding area 40.

In the embodiment, the predetermined value can be set in multiple manners, as long as it is able to draw a reasonable predetermined value to achieve the purpose of the present disclosure. For example, the predetermined value can be obtained by testing or calculating material property of the object or derived according to empirical data. In addition, the predetermined value can be inversely estimated from the best bonding effect by performing bonding experiments on the object. Detailed examples will not be described herein.

Furthermore, referring to FIG. 1 and FIG. 7, in the Step 1, when the tensioning mechanism 3 tensions the flexible display panel 4, the value of tension provided by the tensioning mechanism 3 is less than the predetermined value. In this circumstance, the first rollers (311, 312) and the second rollers (321, 322) of the tensioning mechanism 3 do not roll. Because in the Step 1, the flexible display panel 4 only needs to be preliminarily tensioned, there is no need to apply a great tension, and then in the Step 2, the tension can be further increased to achieve flatness of the flexible display panel 4.

While the present disclosure has been described in detail above with reference to the exemplary embodiments, the scope of the present disclosure is not limited thereto. As will occur to those skilled in the art, the present disclosure is susceptible to various modifications and changes without departing from the spirit and principle of the present disclosure. Therefore, the scope of the present disclosure should be determined by the scope of the claims.

What is claimed is:

1. A bonding apparatus, comprising a base frame and a bonding platform, a tensioning mechanism, and an elevating mechanism which are disposed on the base frame; the tensioning mechanism comprising a first tensioning portion and a second tensioning portion, the first tensioning portion being disposed on one side of the bonding platform and the second tensioning portion being disposed on the other side of the bonding platform, the first tensioning portion being connected to one end of an object and the second tensioning portion being connected to the other end of the object, and the first tensioning portion and the second tensioning portion being configured to tension the object; the bonding platform comprising a bonding plane, the bonding plane being configured to contact the object; and the elevating mechanism being configured to drive at least one of the bonding plane and the tensioning mechanism, to generate a relative displacement between the bonding plane and the tensioning mechanism, and make a surface of the object smooth in contact with the bonding plane under an action of both of the bonding platform and the tensioning mechanism, wherein the first tensioning portion comprises a pair of first rollers disposed apart from and opposite to each other and the first rollers are configured to clamp one end of the object; wherein the first rollers do not roll when a first friction between the first rollers and the object is less than or equal to a predetermined value, and the first rollers roll when the first friction is greater than the predetermined value; and the second tensioning portion comprises a pair of second rollers disposed apart from and opposite to each other and the second rollers are configured to clamp the other end of the object; wherein the second rollers do not roll when a second friction between the second rollers and the object is less than or equal to the predetermined value, and the second rollers roll when the second friction is greater than the predetermined value.

2. The apparatus of claim 1, wherein the elevating mechanism comprises a first driving component, and the first driving component connects the bonding platform and the base frame and is configured to drive the bonding platform to move towards or away from the base frame.

3. The apparatus of claim 2, wherein the first driving component comprises a pitch adjusting structure, a first connecting rod, and a second connecting rod having a length equal to that of the first connecting rod; wherein a middle part of the first connecting rod is hinged with a middle part of the second connecting rod, and the pitch adjusting structure is configured to adjust a distance between one end of the first connecting rod and one end of the second connecting rod.

4. The apparatus of claim 1, wherein the elevating mechanism comprises a first driving component, and the bonding platform comprises a first portion and a second portion, wherein
   an upper surface of the first portion is the bonding plane and the second portion is fixed to the base frame; and
   the first driving portion is disposed between the first portion and the second portion and configured to drive the first portion to move towards or away from the second portion.

5. The apparatus of claim 2, wherein the bonding platform comprises a first protrusion, a second protrusion, and a third protrusion, wherein
   the first driving component is configured to drive the first protrusion to rise, whereby an upper surface of the first protrusion forms the bonding plane; or
   the first driving component is configured to drive the first protrusion and the second protrusion to rise, whereby the upper surface of the first protrusion and an upper surface of the second protrusion are coplanar to form the bonding plane; or
   the first driving component is configured to drive the first protrusion, the second protrusion, and the third protrusion to rise, whereby the upper surface of the first protrusion, the upper surface of the second protrusion, and an upper surface of the third protrusion are coplanar to form the bonding plane.

6. The apparatus of claim 1, wherein the elevating mechanism comprises a second driving component, and the second driving component comprises a first bracket disposed on one side of the bonding platform and a second bracket disposed on the other side of the bonding platform, wherein
   the first bracket is provided with a first sliding rail, the second bracket is provided with a second sliding rail, and sliding paths of the first sliding rail and the second sliding rail are both perpendicular to the bonding plane; and
   the first tensioning portion is movably connected to the first sliding rail and the second tensioning portion is movably connected to the second sliding rail.

7. The apparatus of claim 4, wherein the first driving component comprises a pitch adjusting structure, a first connecting rod, and a second connecting rod having a length equal to that of the first connecting rod; wherein a middle part of the first connecting rod is hinged with a middle part of the second connecting rod, and the pitch adjusting structure is configured to adjust a distance between one end of the first connecting rod and one end of the second connecting rod.

* * * * *